(12) United States Patent
Tollefsbol et al.

(10) Patent No.: US 10,129,993 B2
(45) Date of Patent: Nov. 13, 2018

(54) SEALED ENCLOSURE FOR PROTECTING ELECTRONICS

(71) Applicant: Transtector Systems, Inc., Hayden, ID (US)

(72) Inventors: Trevor Orion Tollefsbol, Coeur d'Alene, ID (US); Eric Nguyen, Coeur d'Alene, ID (US); Jonah Griffith, Seattle, WA (US); Phelan Miller, Seward, AK (US)

(73) Assignee: TRANSTECTOR SYSTEMS, INC., Hayden, ID (US)

( * ) Notice: Subject to any disclaimer, the term of this patent is extended or adjusted under 35 U.S.C. 154(b) by 0 days.

(21) Appl. No.: 15/173,230

(22) Filed: Jun. 3, 2016

(65) Prior Publication Data

US 2016/0366776 A1    Dec. 15, 2016

Related U.S. Application Data

(60) Provisional application No. 62/173,000, filed on Jun. 9, 2015.

(51) Int. Cl.
| | |
|---|---|
| *H05K 5/02* | (2006.01) |
| *B65D 25/22* | (2006.01) |
| *B65D 43/22* | (2006.01) |
| *B65D 81/07* | (2006.01) |

(Continued)

(52) U.S. Cl.
CPC .......... *H05K 5/0239* (2013.01); *B65D 25/22* (2013.01); *B65D 43/22* (2013.01); *B65D 81/07* (2013.01); *H02G 3/088* (2013.01); *H05K 5/0213* (2013.01); *H05K 5/0221* (2013.01); *H05K 5/0247* (2013.01); *H05K 5/068* (2013.01)

(58) Field of Classification Search
CPC ............ H02G 3/088; H02G 3/10; H02G 3/16; H02G 15/013; H02G 3/32; G02B 6/426; H05K 5/0204; H05K 5/069; H05K 5/0213; H05K 5/0221; H05K 5/0239; H05K 5/0247; H05K 5/068; B65D 25/22; B65D 43/22; B65D 81/07
See application file for complete search history.

(56) References Cited

U.S. PATENT DOCUMENTS

| | | |
|---|---|---|
| 2,030,179 A | 2/1936 | Potter |
| 3,167,729 A | 1/1965 | Hall |
| 3,323,083 A | 5/1967 | Ziegler |

(Continued)

FOREIGN PATENT DOCUMENTS

| | | |
|---|---|---|
| CH | 675933 | 11/1990 |
| JP | 08-066037 | 3/1996 |

(Continued)

*Primary Examiner* — James Wu
(74) *Attorney, Agent, or Firm* — Snell & Wilmer LLP

(57) ABSTRACT

A system and an enclosure for protecting one or more electronic devices and having a rear base defining a cavity for holding the electronic device. The enclosure has a front cover coupled to the rear base and moveable between an open position and a closed position and a removable tear-away plug that when removed allows water to drain out of the enclosure. The enclosure has a rear base external surface that has a vertical indented portion configured to receive a pole and a horizontal indented portion and a slot configured to receive a fastener for attachment to the pole.

20 Claims, 11 Drawing Sheets

(51) Int. Cl.
*H05K 5/06* (2006.01)
*H02G 3/08* (2006.01)

(56) References Cited

U.S. PATENT DOCUMENTS

| | | | |
|---|---|---|---|
| 3,596,165 A | 7/1971 | Andrews | |
| 3,619,721 A | 11/1971 | Westendorp | |
| 3,663,901 A | 5/1972 | Forney, Jr. | |
| 3,731,234 A | 5/1973 | Collins | |
| 3,750,053 A | 7/1973 | LeDonne | |
| 3,783,178 A | 1/1974 | Philibert | |
| 3,831,110 A | 8/1974 | Eastman | |
| 3,832,627 A | 8/1974 | Ohsawa | |
| 3,845,358 A | 10/1974 | Anderson et al. | |
| 3,921,015 A | 11/1975 | Obeda et al. | |
| 3,944,937 A | 3/1976 | Fujisawa et al. | |
| 3,956,717 A | 5/1976 | Fisher et al. | |
| 3,980,976 A | 9/1976 | Tadama et al. | |
| 4,021,759 A | 5/1977 | Camp | |
| 4,046,451 A | 9/1977 | Juds et al. | |
| 4,047,120 A | 9/1977 | Lord et al. | |
| 4,112,395 A | 9/1978 | Seward | |
| 4,262,317 A | 4/1981 | Baumbach | |
| 4,356,360 A | 10/1982 | Volz | |
| 4,359,764 A | 11/1982 | Block | |
| 4,384,331 A | 5/1983 | Fukuhara et al. | |
| 4,409,637 A | 10/1983 | Block | |
| 4,481,641 A | 11/1984 | Gable et al. | |
| 4,554,608 A | 11/1985 | Block | |
| 4,563,720 A | 1/1986 | Clark | |
| 4,586,104 A | 4/1986 | Standler | |
| 4,689,713 A | 8/1987 | Hourtane et al. | |
| 4,698,721 A | 10/1987 | Warren | |
| 4,727,350 A | 2/1988 | Ohkubo | |
| 4,901,183 A | 2/1990 | Lee | |
| 4,952,173 A | 8/1990 | Peronnet et al. | |
| 4,984,146 A | 1/1991 | Black et al. | |
| 4,985,800 A | 1/1991 | Feldman et al. | |
| 5,053,910 A | 10/1991 | Goldstein | |
| 5,057,964 A | 10/1991 | Bender et al. | |
| 5,102,818 A | 4/1992 | Paschke et al. | |
| 5,122,921 A | 6/1992 | Koss | |
| 5,124,873 A | 6/1992 | Wheeler | |
| 5,142,429 A | 8/1992 | Jaki | |
| 5,166,855 A | 11/1992 | Turner | |
| 5,170,151 A | 12/1992 | Hochstein | |
| 5,278,720 A | 1/1994 | Bird | |
| 5,321,573 A | 6/1994 | Person et al. | |
| 5,353,189 A | 10/1994 | Tomlinson | |
| 5,412,526 A | 5/1995 | Kapp et al. | |
| 5,442,330 A | 8/1995 | Fuller et al. | |
| 5,534,768 A | 7/1996 | Chavannes et al. | |
| 5,537,044 A | 7/1996 | Stahl | |
| 5,611,224 A | 3/1997 | Weinerman et al. | |
| 5,617,284 A | 4/1997 | Paradise | |
| 5,625,521 A | 4/1997 | Luu | |
| 5,667,298 A | 9/1997 | Musil et al. | |
| 5,721,662 A | 2/1998 | Glaser et al. | |
| 5,781,844 A | 7/1998 | Spriester et al. | |
| 5,790,361 A | 8/1998 | Minich | |
| 5,844,766 A | 12/1998 | Miglioli et al. | |
| 5,854,730 A | 12/1998 | Mitchell et al. | |
| 5,943,225 A | 8/1999 | Park | |
| 5,953,195 A | 9/1999 | Pagliuca | |
| 5,963,407 A | 10/1999 | Fragapane et al. | |
| 5,966,283 A | 10/1999 | Glaser et al. | |
| 5,982,602 A | 11/1999 | Tellas et al. | |
| 5,986,869 A | 11/1999 | Akdag | |
| 6,026,458 A | 2/2000 | Rasums | |
| 6,031,705 A | 2/2000 | Gscheidle | |
| 6,054,905 A | 4/2000 | Gresko | |
| 6,060,182 A | 5/2000 | Tanaka et al. | |
| 6,061,223 A | 5/2000 | Jones et al. | |
| 6,086,544 A | 7/2000 | Hibner et al. | |
| 6,115,227 A | 9/2000 | Jones et al. | |
| 6,137,352 A | 10/2000 | Germann | |
| 6,141,194 A | 10/2000 | Maier | |
| 6,177,849 B1 | 1/2001 | Barsellotti et al. | |
| 6,226,166 B1 | 5/2001 | Gumley et al. | |
| 6,236,551 B1 | 5/2001 | Jones et al. | |
| 6,243,247 B1 | 6/2001 | Akdag et al. | |
| 6,252,755 B1 | 6/2001 | Willer | |
| 6,281,690 B1 | 8/2001 | Frey | |
| 6,292,344 B1 | 9/2001 | Glaser et al. | |
| 6,342,998 B1 | 1/2002 | Bencivenga et al. | |
| 6,381,283 B1 | 4/2002 | Bhardwaj et al. | |
| 6,385,030 B1 | 5/2002 | Beene | |
| 6,394,122 B1 | 5/2002 | Sibley et al. | |
| 6,421,220 B2 | 7/2002 | Kobsa | |
| 6,502,599 B1 | 1/2003 | Sibley et al. | |
| 6,527,004 B1 | 3/2003 | Sibley et al. | |
| 6,535,369 B1 | 3/2003 | Redding et al. | |
| 6,721,155 B2 | 4/2004 | Ryman | |
| 6,754,060 B2 | 6/2004 | Kauffman | |
| 6,757,152 B2 | 6/2004 | Galvagni et al. | |
| 6,785,110 B2 | 8/2004 | Bartel et al. | |
| 6,789,560 B1 | 9/2004 | Sibley et al. | |
| 6,814,100 B1 | 11/2004 | Sibley et al. | |
| 6,816,348 B2 | 11/2004 | Chen et al. | |
| 6,968,852 B1 | 11/2005 | Sibley | |
| 6,975,496 B2 | 12/2005 | Jones et al. | |
| 7,082,022 B2 | 7/2006 | Bishop | |
| 7,104,282 B2 | 9/2006 | Hooker et al. | |
| 7,106,572 B1 | 9/2006 | Girard | |
| 7,130,103 B2 | 10/2006 | Murata | |
| 7,159,236 B2 | 1/2007 | Abe et al. | |
| 7,221,550 B2 | 5/2007 | Chang et al. | |
| 7,250,829 B2 | 7/2007 | Namura | |
| 7,430,103 B2 | 9/2008 | Kato | |
| 7,453,268 B2 | 11/2008 | Lin | |
| 7,471,172 B2 | 12/2008 | Holst et al. | |
| 7,507,105 B1 | 3/2009 | Peters et al. | |
| 7,623,332 B2 | 11/2009 | Frank et al. | |
| 7,675,726 B2 | 3/2010 | Bolz et al. | |
| 7,808,752 B2 | 10/2010 | Richiuso et al. | |
| 7,817,398 B1 | 10/2010 | Maples | |
| 2002/0167302 A1 | 11/2002 | Gallavan | |
| 2002/0191360 A1 | 12/2002 | Colombo et al. | |
| 2003/0072121 A1 | 4/2003 | Bartel et al. | |
| 2003/0151870 A1 | 8/2003 | Gronbach et al. | |
| 2003/0179533 A1 | 9/2003 | Jones et al. | |
| 2003/0211782 A1 | 11/2003 | Esparaz et al. | |
| 2004/0100751 A1 | 5/2004 | Ammann | |
| 2004/0121648 A1 | 6/2004 | Voros | |
| 2004/0145849 A1 | 7/2004 | Chang et al. | |
| 2004/0264087 A1 | 12/2004 | Bishop | |
| 2005/0036262 A1 | 2/2005 | Siebenthall et al. | |
| 2005/0044858 A1 | 3/2005 | Hooker et al. | |
| 2005/0176275 A1 | 8/2005 | Hoopes et al. | |
| 2005/0185354 A1 | 8/2005 | Hoopes | |
| 2005/0206482 A1 | 9/2005 | Du Toit et al. | |
| 2006/0044076 A1 | 3/2006 | Law | |
| 2006/0082946 A1 | 4/2006 | Duenez et al. | |
| 2006/0120005 A1 | 6/2006 | Van Sickle | |
| 2006/0139832 A1 | 6/2006 | Yates et al. | |
| 2006/0146458 A1 | 7/2006 | Mueller | |
| 2006/0153362 A1* | 7/2006 | Bloodworth | G02B 6/4448 379/413.02 |
| 2007/0053130 A1 | 3/2007 | Harwath | |
| 2007/0139850 A1 | 6/2007 | Kamel et al. | |
| 2007/0147602 A1* | 6/2007 | Vo | H04M 1/0293 379/413.02 |
| 2008/0170346 A1 | 7/2008 | Van Swearingen | |
| 2009/0103226 A1 | 4/2009 | Penwell et al. | |
| 2009/0109584 A1 | 4/2009 | Jones et al. | |
| 2009/0284888 A1 | 11/2009 | Bartel et al. | |
| 2009/0296430 A1 | 12/2009 | Rieux-Lopez et al. | |
| 2011/0068665 A1 | 3/2011 | Cao | |
| 2011/0080683 A1 | 4/2011 | Jones et al. | |
| 2011/0141646 A1 | 6/2011 | Jones et al. | |
| 2011/0159727 A1 | 6/2011 | Howard et al. | |
| 2011/0226526 A1* | 9/2011 | Chu | H02G 3/088 174/659 |
| 2011/0279943 A1 | 11/2011 | Penwell et al. | |

(56) References Cited

U.S. PATENT DOCUMENTS

| | | | | |
|---|---|---|---|---|
| 2012/0001041 A1* | 1/2012 | Yang | ............... | F16M 11/10 |
| | | | | 248/219.4 |
| 2012/0250272 A1* | 10/2012 | Wang | ............... | H04M 1/18 |
| | | | | 361/752 |
| 2013/0026160 A1* | 1/2013 | Hu | ............ | H02G 3/083 |
| | | | | 220/3.3 |

FOREIGN PATENT DOCUMENTS

| | | |
|---|---|---|
| JP | 11-037400 | 2/1999 |
| JP | 2001-228950 | 8/2001 |
| JP | 2003-070156 | 3/2003 |
| JP | 2003-111270 | 4/2003 |
| KR | 10-2003-0081041 | 10/2003 |
| KR | 10-2009-0018497 | 2/2009 |
| KR | 10-1189670 | 10/2012 |
| WO | WO 95/10116 | 4/1995 |
| WO | PCT/US03/17050 | 5/2003 |
| WO | WO 2011-119723 | 12/2011 |

* cited by examiner

SEALED ENCLOSURE FOR PROTECTING ELECTRONICS

CROSS-REFERENCE TO RELATED APPLICATIONS

This application claims priority to and the benefit of U.S. Provisional Application 62/173,000, titled "SEALED ENCLOSURE FOR PROTECTING ELECTRONICS," filed on Jun. 9, 2015, and the entirety of which is hereby incorporated by reference.

BACKGROUND

Field

The present invention relates to a sealed enclosure for protecting electronics.

Description of the Related Art

Electronic circuit boards have sensitive electronics that require protection from the elements. Electronic circuit boards are susceptible to both dust and water. Thus, electronic circuit boards are stored in various cases and/or enclosures to protect the electronic circuit boards from the surrounding environment. However, even the most air-tight cases and enclosures are susceptible to dust and condensation through one or more cracks within the seal of the enclosure. Moreover, the electronic circuit boards may need to remain electrically connected to an electronic device and any dust and condensation that forms on the inside of the enclosure may need to be extracted from within the enclosure while the electronic circuit board is protected within the enclosure.

SUMMARY

In general one aspect of the subject matter described in this specification is embodied in an enclosure for protecting an electronic device and having a rear base defining a cavity for holding the electronic device, a front cover coupled to the rear base and moveable between an open position and a closed position and a removable tear-away plug that when removed allows water to drain out of the enclosure.

These and other embodiments may include one or more of the following features. The rear base may have an external surface with a vertical indented portion that may receive a pole and a horizontal indented portion and a slot that may receive a fastener for attachment to the pole. The vertical indented portion may be trapezoidal in shape, and the fastener may be a hose clamp or a tie wrap. The trapezoidal shape advantageously provides a better securement and attachment to the pole.

The enclosure may have a suspension device coupled to the rear base that couples to the electronic device and holds the electronic device within the cavity. The electronic device may be suspended away from an inner surface of the rear base and an inner surface of the front cover. The enclosure may have a polymer membrane that encircles a contour of the rear base that interfaces with a contour of the front cover in the closed position. The enclosure may have a latch coupled to the front cover. The latch and the polymer membrane may be configured to seal the enclosure when the front cover is in the closed position.

The enclosure may have one or more openings that may be configured to receive one or more cables that electrically connect to the electronic device. Each opening may have an edge that has a polymer membrane that forms a seal around the one or more cables. The one or more openings may be configured to receive a signal input, a signal output and a ground cable. The one or more openings and the removable tear away plugs may be positioned on a bottom surface of the enclosure.

The front cover may be curved so that when the enclosure lies on the rear base water may runoff a surface of the front cover. The rear base and the front cover may each have a protruding portion that may be configured to be shaped as handles when the front cover is in the closed position. The rear base may have one or more holes that are configured to receive a fastener that mounts the enclosure to the wall. The one or more holes may be hidden when the front cover is in the closed position. The rear base may be configured to receive one or more poles of different sizes.

In another aspect, the subject matter is embodied in an enclosure for protecting an electronic device and having a rear base defining a first cavity for holding the electronic device. The enclosure may have a front cover coupled to the rear base and defining a second cavity, and one or more snap hooks coupled to the rear base and configured to suspend the electronic device within the first cavity and the second cavity.

In another aspect, the subject matter is embodied in an electronic device enclosure system. The electronic device enclosure system may include an electronic device and an enclosure. The enclosure may have a rear base defining a cavity for holding the electronic device and a front cover movable between an open position and a closed position. The enclosure may have one or more snap hooks coupled to the rear base and the electronic device. The snap hooks may be configured to hold the electronic device within the cavity.

BRIEF DESCRIPTION OF THE DRAWINGS

Other systems, methods, features, and advantages of the present invention will be or will become apparent to one with skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Disclosed herein are enclosures and systems for carrying, storing and protecting an electronic device. Particular embodiments of the subject matter described in this specification may be implemented to realize one or more of the following advantages. An electronic control system that has a sealed enclosure to protect an electronic device from the surrounding environment and is able to be secured to a structure, such as a wall. The sealed enclosure forms an air-tight seal that prevents water vapor and dust from being in contact with an electronic device stored within the enclosure while allowing the electronic device within the sealed enclosure to maintain an electrical connection with another electronic device outside the sealed enclosure. Multiple electronic devices may be stored within the sealed enclosure while maintaining electrical contact with another electronic device outside the sealed enclosure. By having the ability to be secured to a structure, the sealed enclosure may be positioned for ease of access and above ground to prevent contact with water and dust on the ground.

Other benefits and advantages may include the capability to prevent accumulation of surface water on exterior surfaces of the sealed enclosure. Another benefit and advantage may include the capability to dispose of accumulated surface water within the sealed enclosure. For example, if water or water vapor accumulates within the sealed enclosure, the water or water vapor may be drained from the sealed enclosure. Additionally, the sealed enclosure suspends the electronic device within a cavity to prevent contact with any wet surface. Thus, the sealed enclosure provides additional protection for the electronic device to prevent, minimize or mitigate any contact the electronic device has with dust or water while within the sealed enclosure.

Figure 1:
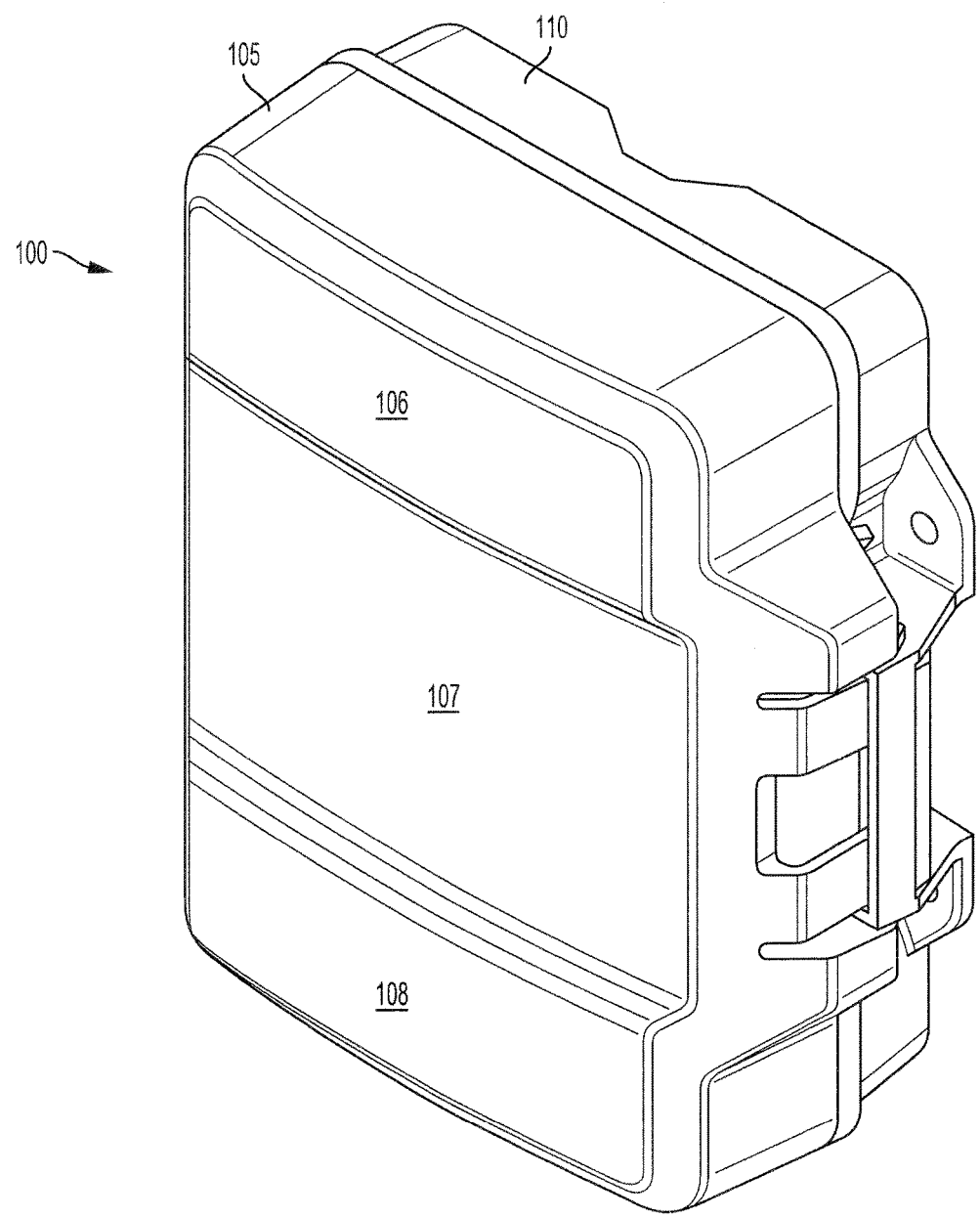
FIG. 1 is a perspective front view of an enclosure for protecting electronics according to an embodiment of the present invention.
Figure 2:
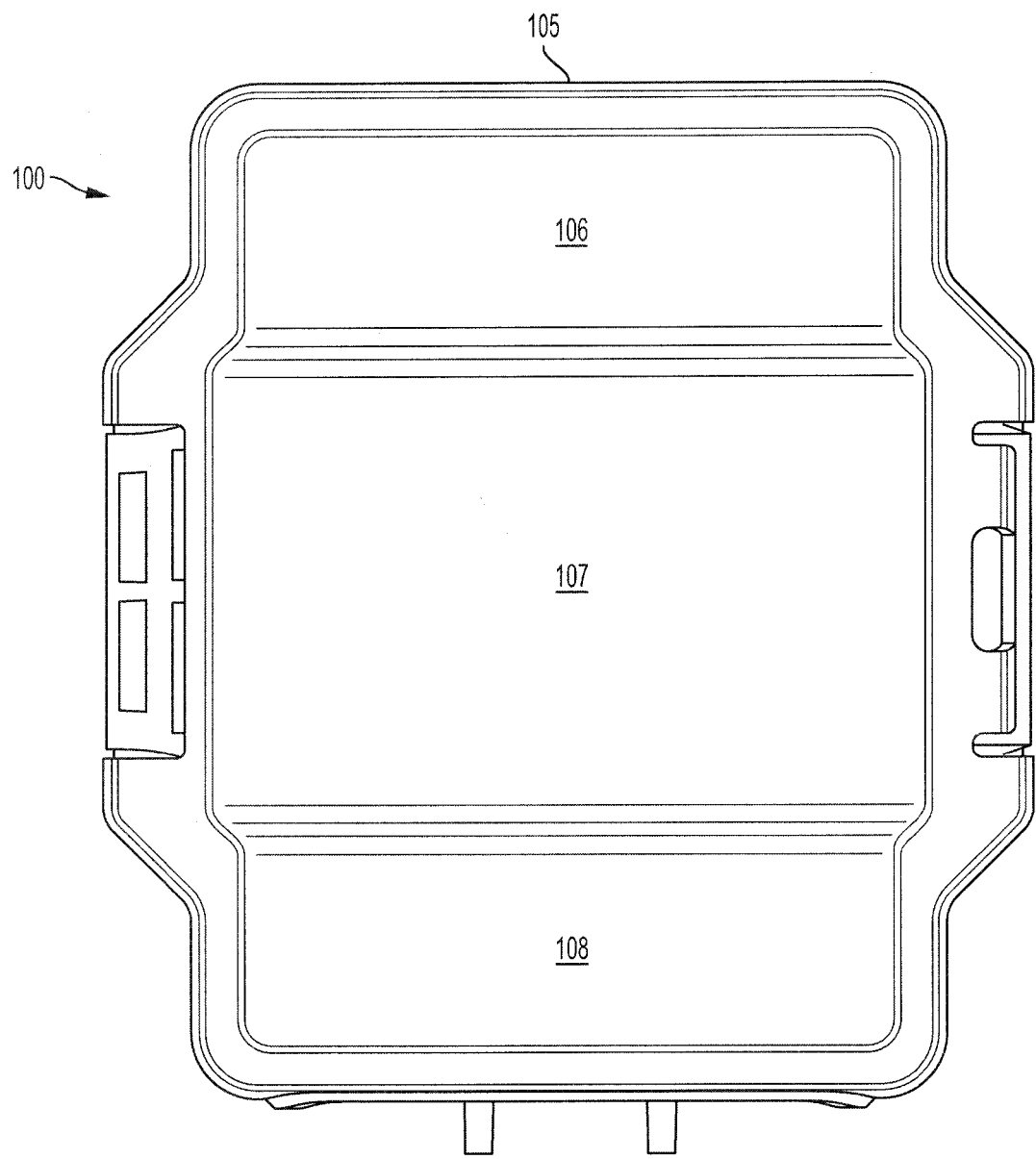
FIG. 2 is a front view of the enclosure of FIG. 1 for protecting electronics according to an embodiment of the present invention.

FIG. 1 is a perspective front view and FIG. 2 is a front view of an example case or enclosure 100 (hereinafter "enclosure") for protecting electronics. The enclosure 100 may be an indoor and/or outdoor case that seals and protects inside electronics when closed and provides protection against environmental conditions or damage, such as water, contaminants, dust or dirt. The inside electronics may include one or more electronic devices, such as an electronic circuit board 1315, having radio frequency (RF) chips, Ethernet chips or circuits, data processing circuits and/or surge suppression circuits thereon. The enclosure 100 may include an environmental rating from an independent organization such as the National Electrical Manufacturer Association (NEMA) or the International Electrotechnical Commission (ICE).

Figure 13:
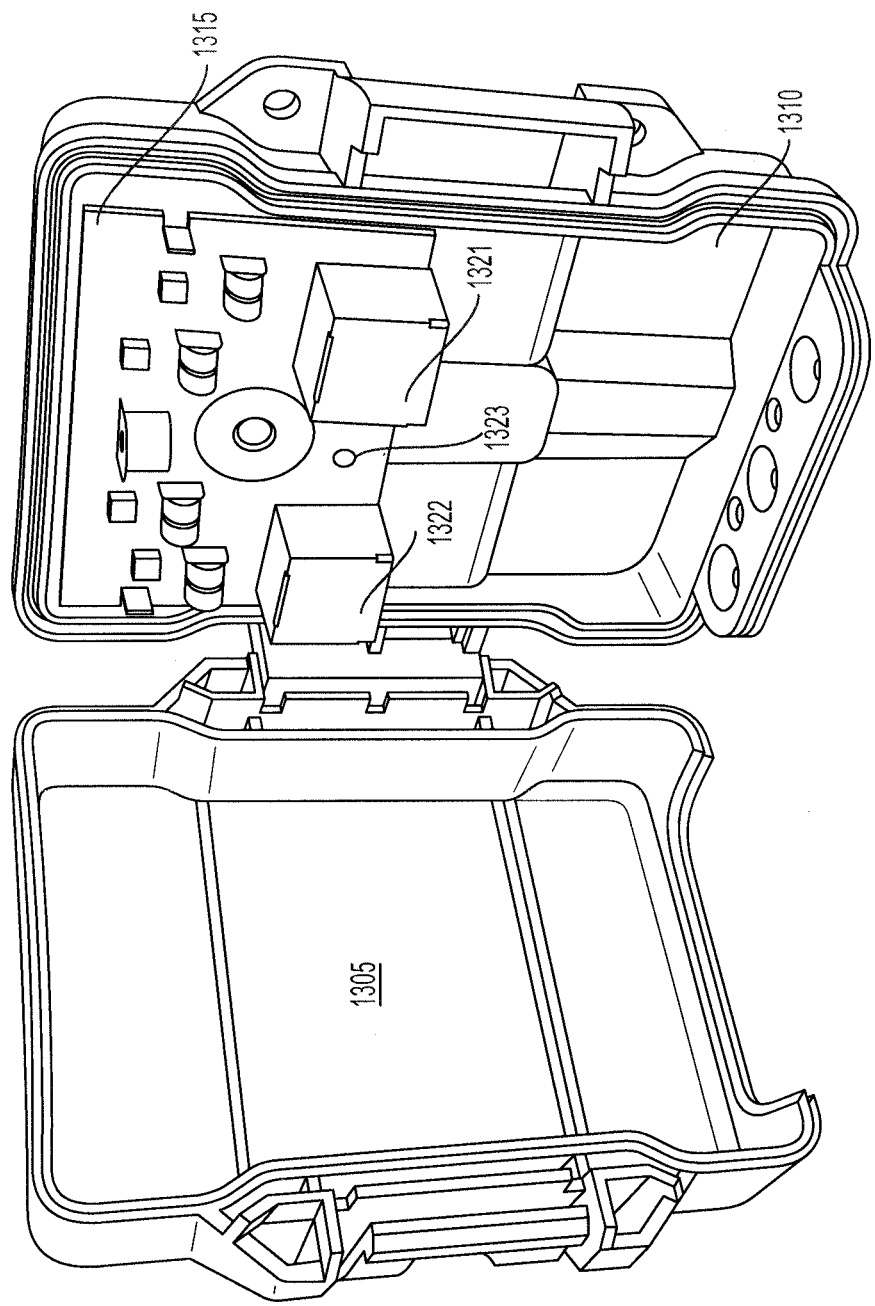
FIG. 13 is a top view showing the internal cavities of the front cover and the rear base according to an embodiment of the present invention.

The enclosure 100 has a front cover 105 defining an inner cavity 1305 and a rear base 110 defining an inner cavity 1310 (see also FIG. 13). The inner cavity 1305 of the front cover 105 and the inner cavity 1310 of the rear base 110 may be apportioned into one or more regions so that one or more electronic devices may be suspended in the one or more regions by one or more snap hooks or pins 1405 in the sealed enclosure 100.

The front cover 105 may have one or more panels. The one or more panels may be slightly curved outward to allow for any moisture or water to runoff the surface of the one or more panels. The curved portion may direct the runoff away from the gasket 515. For example, the front cover 105 of enclosure 100 has a unique 3-panel, curved, staggered exterior cover. Each of the three panels, i.e., the top panel 106, the center panel 107 and the bottom panel 108, is slightly curved outward and the center panel 107 is indented. The front cover 105 may be made of a hard plastic material.

Figure 3:
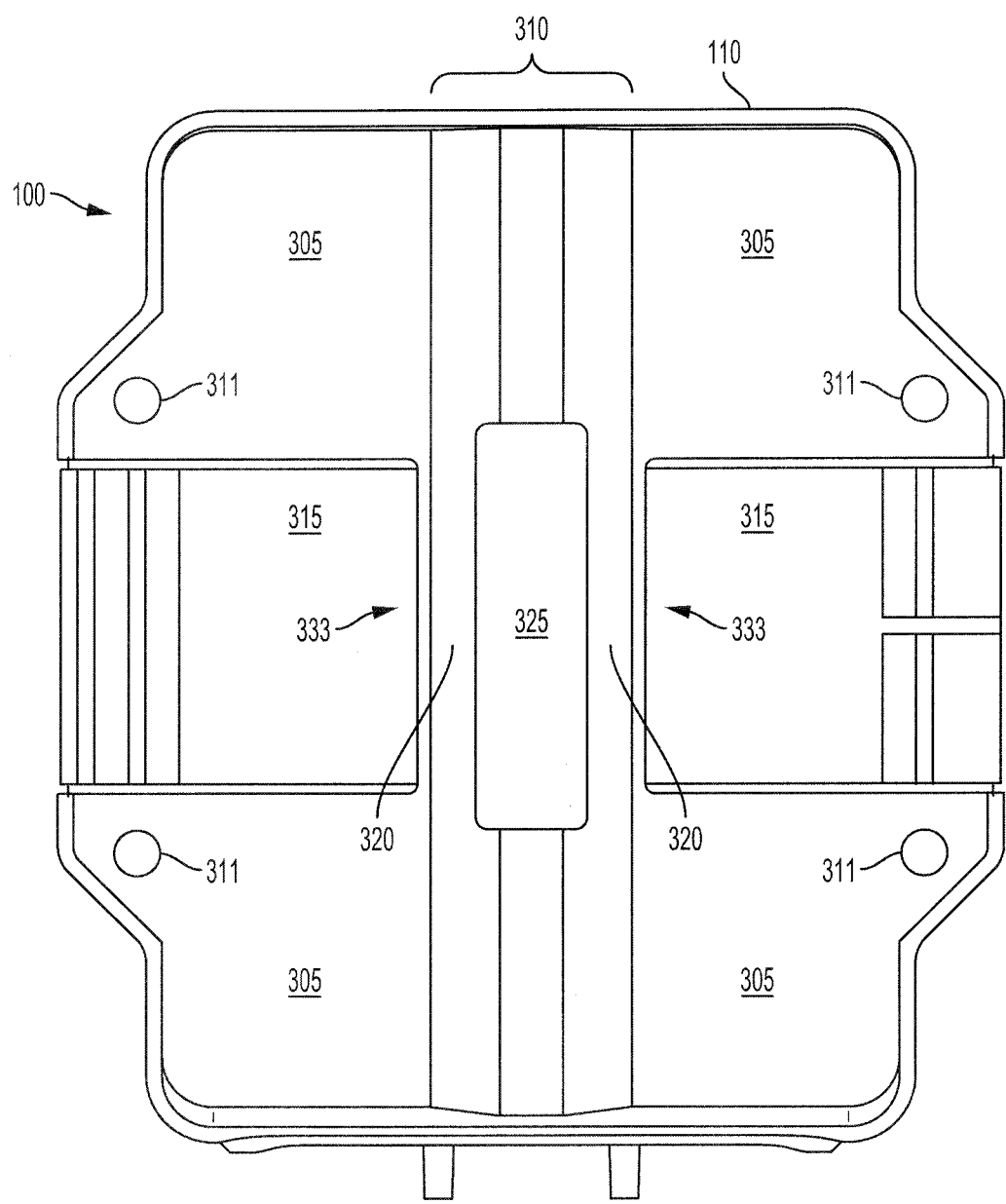
FIG. 3 is a rear view of the enclosure of FIG. 1 for protecting electronics according to an embodiment of the present invention.

FIG. 3 is a rear view of the enclosure 100 of FIG. 1 for protecting electronics. The rear base 110 may be configured to be easily attached or fastened to a pole 801 or a wall in a wall mount configuration. That is, the rear base 110 is designed and shaped to allow for easy mounting and installation to the pole 801 or attachment to the wall. The rear base 110 may have one or more vertical indented portions, such as a vertical indented portion 310 that may be shaped to fit multiple pole diameters for attachment purposes (see also FIG. 8). For example, the vertical indented portion 310 may be sized to fit a 1¼ inch in diameter pole. The vertical indented portion 310 may be curved or angular in shape, e.g., in a trapezoidal shape, and may extend the height of the rear base 110. The rear base 110 may have flat portions 305 that are on the left and right sides adjacent to the vertical indented portion 310 and may be used to be positioned against a flat surface, such as a wall. The flat portions 305 and/or the vertical indented portion 310 may have sticky or adhesive pads attached for simplifying installation prior to attachment. The flat portions 305 may have one or more holes 311 that each may receive a screw that may be used to mount the enclosure 100 to a wall. In one embodiment, the one or more holes 311 are positioned on a portion of the rear base 110 covered by a portion of the front cover 105 when the front cover 105 is closed against the rear base 110 so that the portion of the front cover 105 prevents access to and visibility of the one or more holes 311 and any screws received by the one or more holes 311.

For installation, the flat portions 305 and/or the vertical indented portion 310 are placed against a wall or the pole 801 such that the sticky or adhesive pads attach to the wall or the pole 801. This allows the installer to accurately place the rear base 110 in the correct location on the wall or on the pole 801 prior to inserting or drilling the screws into the wall or placing a pole fastener through slots 333 of the rear base 110 to attach the pole fastener onto the pole 801 (see also FIGS. 8 and 9).

Figure 9:
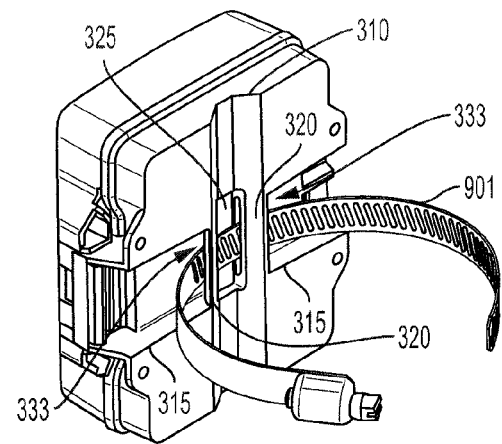
FIG. 9 is a perspective rear view of the enclosure of FIG. 1 showing a hose clamp (or a tie wrap) positioned into slots of the rear base so that the hose clamp can be attached to a pole according to an embodiment of the present invention.

The center or middle portion of the rear base 110 may have one or more horizontal indented portions 315 and one or more vertical columns 320 next to a center cutout 325 (see FIGS. 3 and 9). The one or more horizontal indented portions 315 may extend the entire width of the rear base 110 and may allow for the pole fastener to be easily inserted into one or more slots 333 to pass through a portion of the enclosure 100 and under the vertical columns 320. The center cutout 325 may allow the installer to see and direct the pole fastener through the one or more slots 333. The structure of the horizontal indented portions 315, the vertical columns 320 and the center cutout 325 may allow for an integral configuration for the installation of the pole fastener. In one embodiment, the center cutout 325 may be removed and the pole fastener may be passed under a single vertical column 320.

Figure 4:
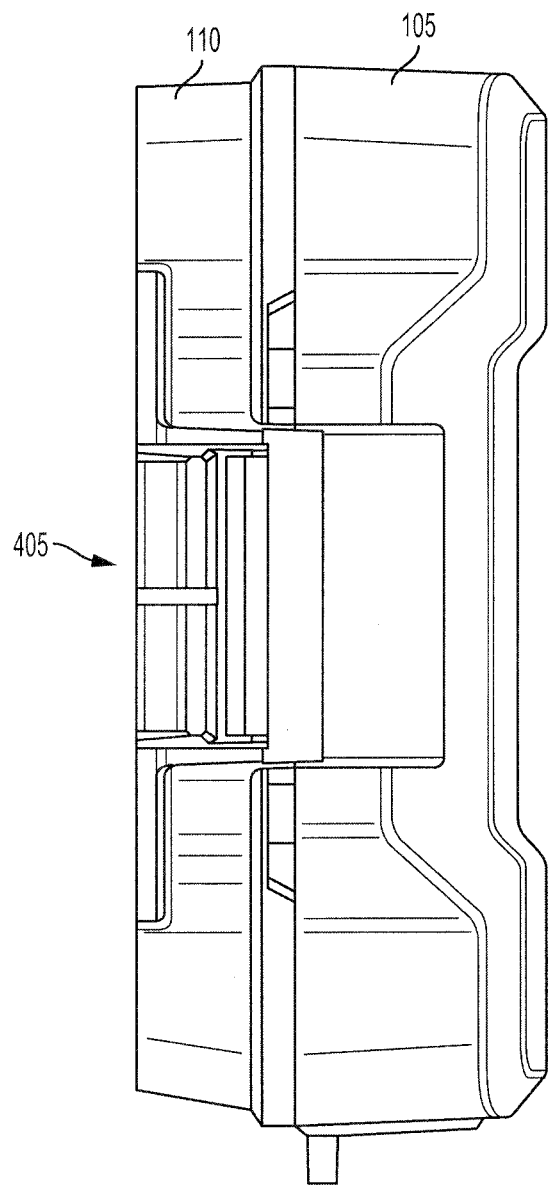
FIG. 4 is a left side view of the enclosure of FIG. 1 for protecting electronics according to an embodiment of the present invention.

FIG. 4 is a left side view of the enclosure 100 of FIG. 1 for protecting electronics. The enclosure 100 has one or more hinges 405 that allow the front cover 105 to be opened relative to the rear base 110 and move between an open position and a closed position. The one or more hinges 405 allow the front cover 105 and the rear base 110 to be moveably coupled to one another.

Figure 5:
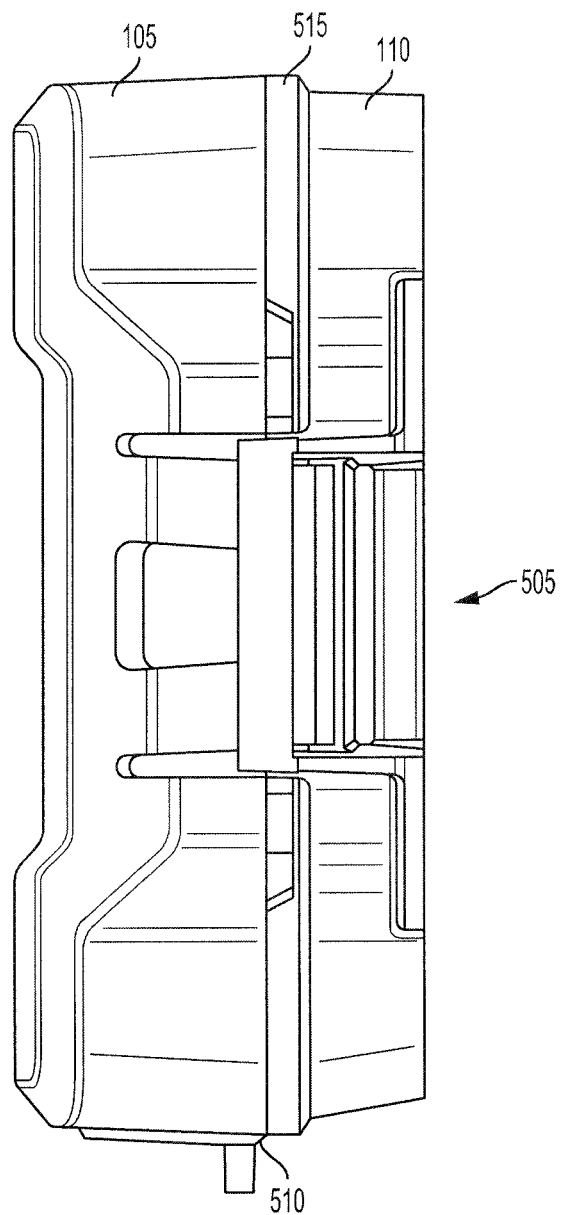
FIG. 5 is a right side view of the enclosure of FIG. 1 for protecting electronics according to an embodiment of the present invention.

FIG. 5 is a right side view of the enclosure 100 of FIG. 1 for protecting electronics. The enclosure 100 has a fastening or locking mechanism 505, such as a latch, that secures the front cover 105 in a closed position with the rear base 110. The fastening or locking mechanism 505 may be released, snapped or fastened together to open or close the enclosure 100. The fastening or locking mechanism 505 may be part of a portion of the front cover 105 and may be configured to fasten to a portion of the rear base 110. In some implementations, the fastening or locking mechanism 505 may be part of a portion of the rear base 110 and may be configured to fasten to a portion of the front cover 105. The fastening or locking mechanism 505 and the opposing portion of the front cover 105 or the rear base 110 may have a slit that allows a zip tie to pass through to keep the front cover 105 closed around the rear base 110.

The front cover 105 may have a lip 510 that interfaces with a gasket 515 that resides within a groove around the perimeter of the rear base 110. The lip 510 may be shaped to create a torturous path that prevents any water or liquid runoff from entering the sealed enclosure 100 from the side of the enclosure 100. The gasket 515 may reside within the groove that is around the inner perimeter of the edge of the rear base 110.

The gasket 515 may interface with the lip 510 to form a seal around the enclosure 100 where the front cover 105 and the rear base 110 interface when the front cover 105 is in the closed position. The gasket 515 may be made of an elastic polymer that compresses against the lip 510 to create the seal around the enclosure 100.

Figure 6:
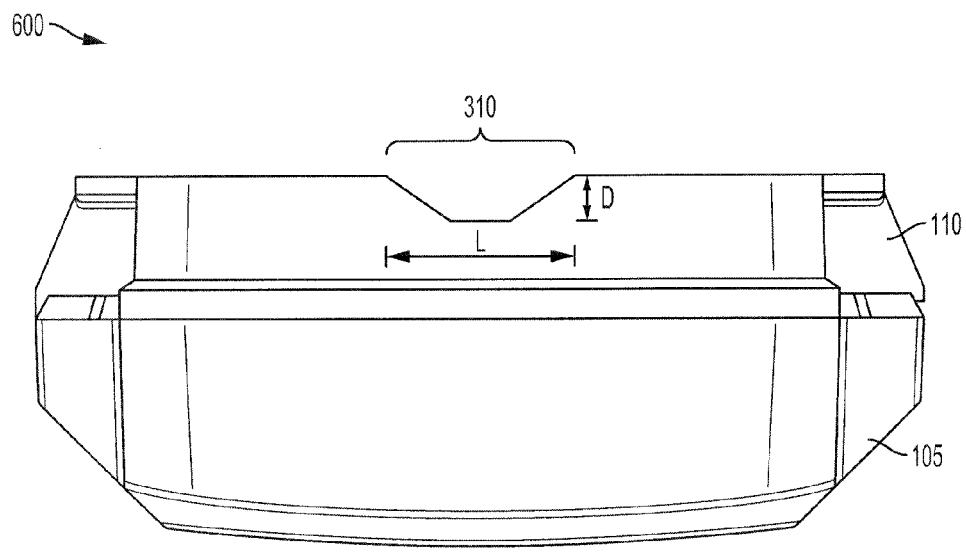
FIG. 6 is a top view of the enclosure of FIG. 1 for protecting electronics according to an embodiment of the present invention.

FIG. 6 is a top view of the enclosure 100 of FIG. 1 for protecting electronics. The enclosure 100 may have a top 600 and a bottom 700. The top 600 may be curved so that moisture or liquids are directed off the enclosure 100 and/or away from the interface of the lip 510 of the front cover 105 and the gasket 515.

The vertical indented portion 310 may be indented into the rear base 110 by a distance D, which may be about 0.5 inches. The distance D and the length L of the vertical indented portion 310 may vary depending on the diameter of the pole 801. The vertical indented portion 310 may be curved or angular, such as in a hexagonal or octagonal shape.

Figure 7:
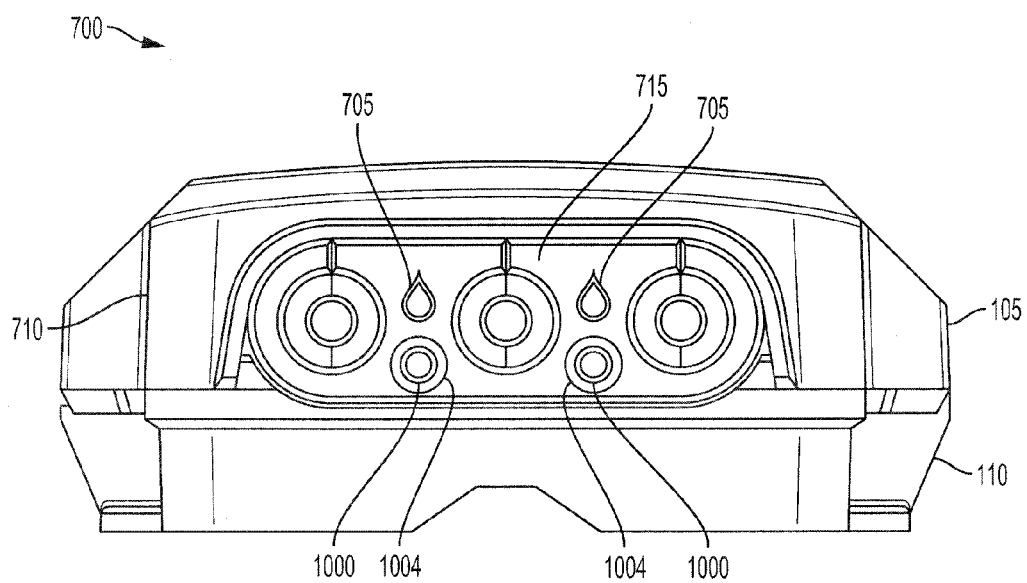
FIG. 7 is a bottom view of the enclosure of FIG. 1 showing two water drop symbols and two removable tear-away drainage plugs according to an embodiment of the present invention.

FIG. 7 is a bottom view of the enclosure 100 of FIG. 1 showing two water drop symbols 705 and two removable tear-away drainage plugs 1000. The enclosure 100 may have a bottom 700. The bottom 700 may have a grommet 715 that has two water drop symbols 705 and two removable tear-away drainage plugs (or nubs) 1000. The grommet 715 may be a single piece that is molded onto the rear base 110 of the enclosure 100. The single piece that is molded may include the gasket 515 that runs around the perimeter of the rear base 110 of the enclosure 100 and may be molded into a groove that runs along the perimeter of the rear base 110 of the enclosure 100.

The enclosure 100 may have one or more water drop symbols 705, such as the two water drop symbols 705 and one or more removable tear-away drainage plugs 1000, such as the two removable tear-away drainage plugs 1000 on, for example, the grommet 715. The water drop symbols 705 and removable tear-away drainage plugs 1000 may be positioned on the bottom 700 of the enclosure 100. For example, the removable tear-away drainage plugs 1000 may be positioned in the center of the bottom 700 of the enclosure 100. In another example, the removable tear-away drainage plugs 1000 are offset from the center of the bottom 700 of the enclosure 100 such that the removable tear-away drainage plugs 1000 are positioned closer to the back surface of the enclosure 100 than the interface of the front cover 105 and the rear base 110. The offset configuration of the removable tear-away drainage plugs 1000 allows water or other fluids to exit when the back surface of the enclosure 100 is laying on a non-vertical surface, such as the ground.

The two water drop symbols 705 are used to indicate that the two removable tear-away drainage plugs 1000 may be pulled out to allow for the drainage of water. The two removable tear-away drainage plugs 1000 may be pulled out to drain water from the inside of the enclosure 100. For example, moisture or fluid may be present inside the enclosure 100 and may accumulate on a sloped side or bottom internal surface 710 of the rear base 110. The sides or bottom internal surfaces 710 adjacent to the holes 1004 may be sloped towards the holes 1004 to allow the fluid to more easily and quickly drain. The removable tear-away drainage plugs 1000 may be positioned on the bottom of the enclosure 100 and may be molded as part of the grommet 715 so that when the removable tear-away drainage plugs 1000 are in place, the enclosure 100 is completely sealed when closed. The removable tear-away drainage plugs 1000 may be perforated to allow for easy removal. If the removable tear-away drainage plugs 1000 are pulled out, holes 1004 will appear to allow for the moisture or fluid to exit the enclosure 100. This advantageously prevents accumulation of moisture, water or fluid within the enclosure 100.

The one or more removable tear-away drainage plugs 1000 may be made of a non-rigid material that allows the one or more removable tear-away drainage plugs 1000 to be torn or removed easily, such as rubber or other elastomer material.

Figure 8:
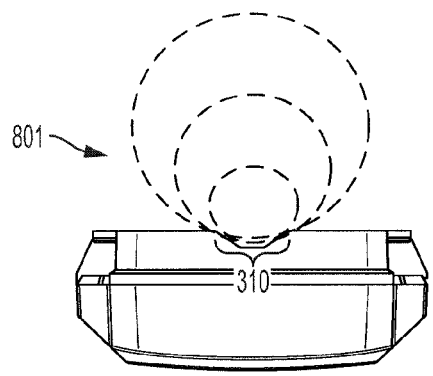
FIG. 8 is a top view of the enclosure of FIG. 1 showing poles of varying diameters partially positioned within the vertical indented portion according to an embodiment of the present invention.

FIG. 8 is a top view of the enclosure 100 of FIG. 1 showing poles of varying diameters partially positioned within the vertical indented portion 310.

FIG. 9 is a perspective rear view of the enclosure 100 of FIG. 1 showing a pole fastener, such as a hose clamp 901 or a tie wrap, positioned into slots 333 of the rear base 110 so that the pole fastener may be attached to a pole 801. The pole fastener allows for a secure and strong attachment of the enclosure 100 to the pole 801.

Figure 10:
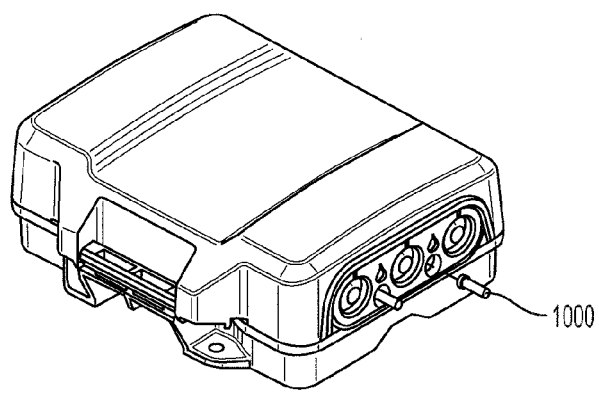
FIG. 10 is a perspective bottom view of the enclosure of FIG. 1 showing two removable tear-away drainage plugs (or nubs) according to an embodiment of the present invention.

FIG. 10 is a perspective bottom view of the enclosure 100 of FIG. 1 showing two removable tear-away drainage plugs (or nubs) 1000.

Figure 11:
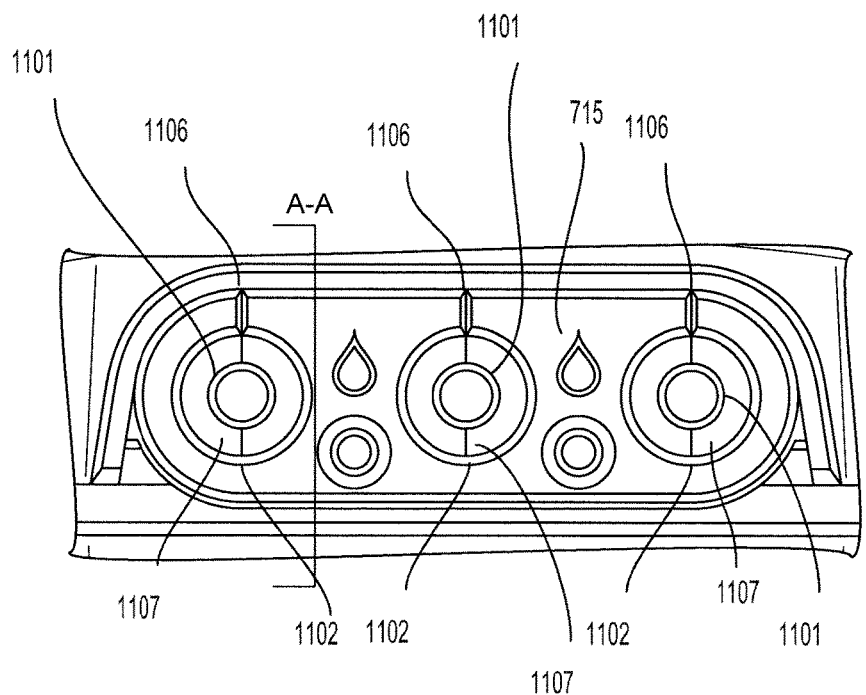
FIG. 11 is a bottom view of the enclosure of FIG. 1 showing three removable tear-away inlet ports and three cable inlet ports according to an embodiment of the present invention.

FIG. 11 is a bottom view of the enclosure 100 of FIG. 1 showing three removable tear-away inlet plugs 1101 and three cable inlet ports 1102, on the grommet 715. The bottom 700 of the enclosure 100 may have three removable tear-away inlet plugs 1101 and three cable inlet ports 1102. The one or more removable tear-away cable inlet plugs 1101 may be pulled to create one or more cable inlet ports 1102 for the passage of wires or cables. For example, the electronic circuit board 1315 may have signal in, signal out and ground cables that need to exit the enclosure 100 for connection to a remote electronic device. Each cable may exit from one of the cable inlet ports 1102. The one or more cable inlet ports 1102 may be conical and may be surrounded by elastomer material 1107 so that a range of cable sizes may be received through the one or more cable inlet ports 1102. The elastomer material 1107 may form a seal around the cables when the one or more removable tear-away cable inlet plugs 1101 are removed and one or more cables are received.

The removable tear-away cable inlet plugs 1101 may be perforated to allow for easy removal. The one or more cable inlet ports 1102 may be aligned with the signal in connector 1321, the signal out connector 1322 and/or the ground 1323 such that the signal in, signal out, ground cables and/or any other input/output cables of the electronic circuit board 1315 may exit through the one or more cable inlet ports 1102 without any guides, such as a fastener.

One or more icons may be in proximity to the one or more cable inlet ports 1102 or the one or more connectors of the electronic circuit board 1315 to indicate the function of the one or more cables attached to the one or more connectors. The grommet 715 may have one or more slits 1106 that may be perforated to allow a cable to be dropped through the top of the grommet 715 into one or more of the cable inlet ports 1102.

The one or more removable tear-away inlet plugs 1101 may be made of a non-rigid material that allows the one or more removable tear-away inlet plugs 1101 to be torn or removed easily, such as rubber or another elastomer material.

Figure 12:
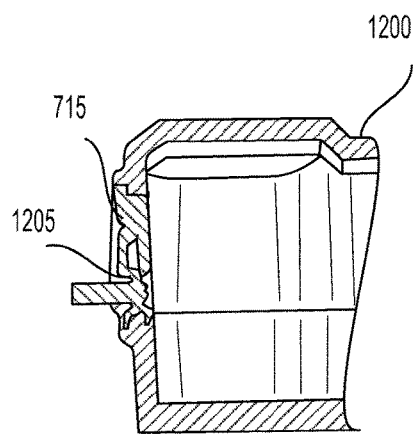
FIG. 12 is a cross-sectional view along line A-A of FIG. 11 according to an embodiment of the present invention.

FIG. 12 is a cross-sectional view along line A-A of FIG. 11 according to an embodiment of the present invention. The cross-section portion 1200 shows the grommet 715 and a thin tear-away section 1205 for a removable tear-away drainage plug 1000.

Figure 14:
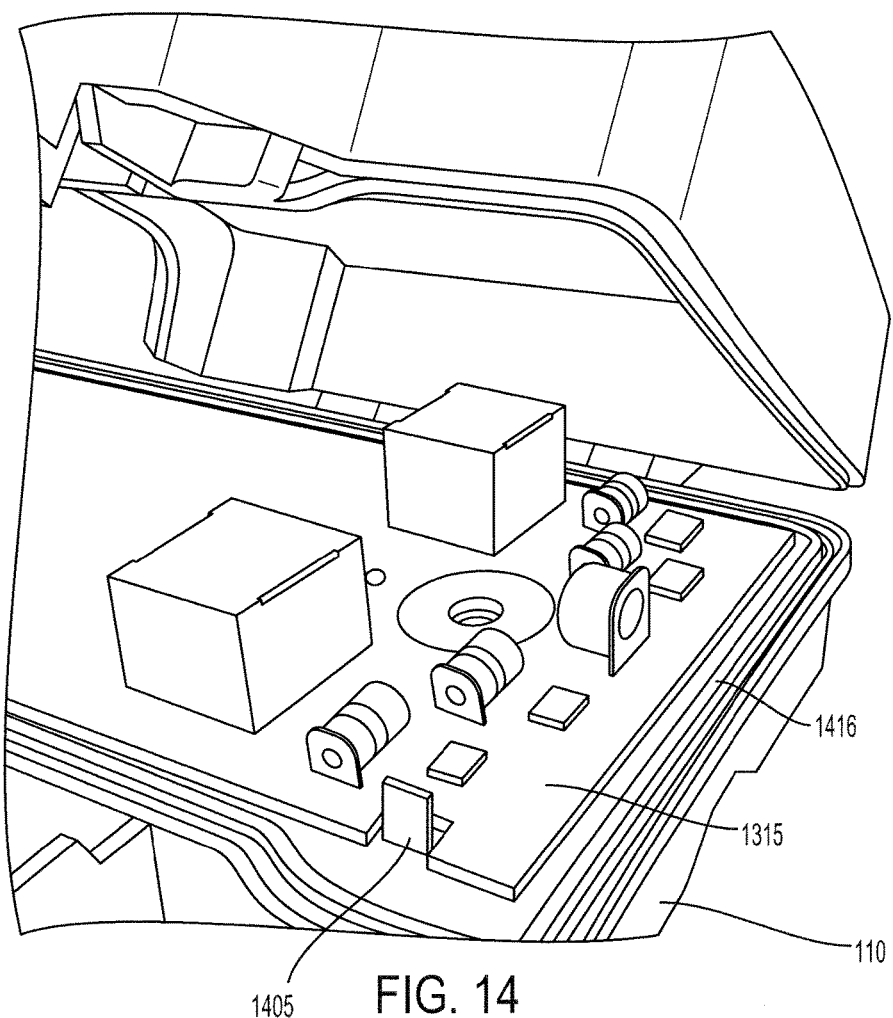
FIG. 14 is a side view of the enclosure showing an electronic device positioned therein according to an embodiment of the present invention.

FIG. 13 is a top view showing the internal cavities of the front cover 105 and the rear base 110, and FIG. 14 is a side view of the enclosure 100 showing an electronic device. The inner cavity 1310 of the rear base 110 may be used to hold the one or more electronic devices, such as the electronic circuit board 1315. The electronic circuit board 1315 may be suspended above a top rim 1416 of the rear base 110 and not directly positioned on an inner surface of the rear base 110. The electronic circuit board 1315 may be suspended in between the inner cavity 1305 of the front cover 105 and the inner cavity 1310 of the rear base 110 so that the electronic circuit board 1315 is not in contact with any surfaces including an inner surface of a top 600 of the enclosure 100 and a bottom 700 of the enclosure 100. The suspended electronic or electronic circuit board 1315 is prevented from contacting any water or other fluid that may accumulate within the enclosure 100. For example, two or more snap hooks or pins 1405 with cutouts may hold the electronic circuit board 1315 in place. The snap hooks or pins 1405 may be used to suspend the electronic circuit board 1315 above the top rim 1416 of the rear base 110. The snap hooks or pins 1405 may be pushed outward to allow the electronic circuit board 1315 to be removably inserted and removed from the suspended position. The snap hooks or pins 1405 may be positioned to reduce interference with any connectors connected to the electronic circuit board 1315 and/or may be positioned so that the electronic circuit board 1315 is biased toward the top of the cavity when suspended by the snap hooks or pins 1405. The electronic circuit board 1315 may include a signal in connector 1321, a signal out connector 1322 and a ground 1323. One or more guides may be positioned within the cavity to guide one or more cables from the connectors through the one or more cable inlet ports 1102 when the one or more removable tear-away inlet plugs 1101 are removed.

Figure 15:
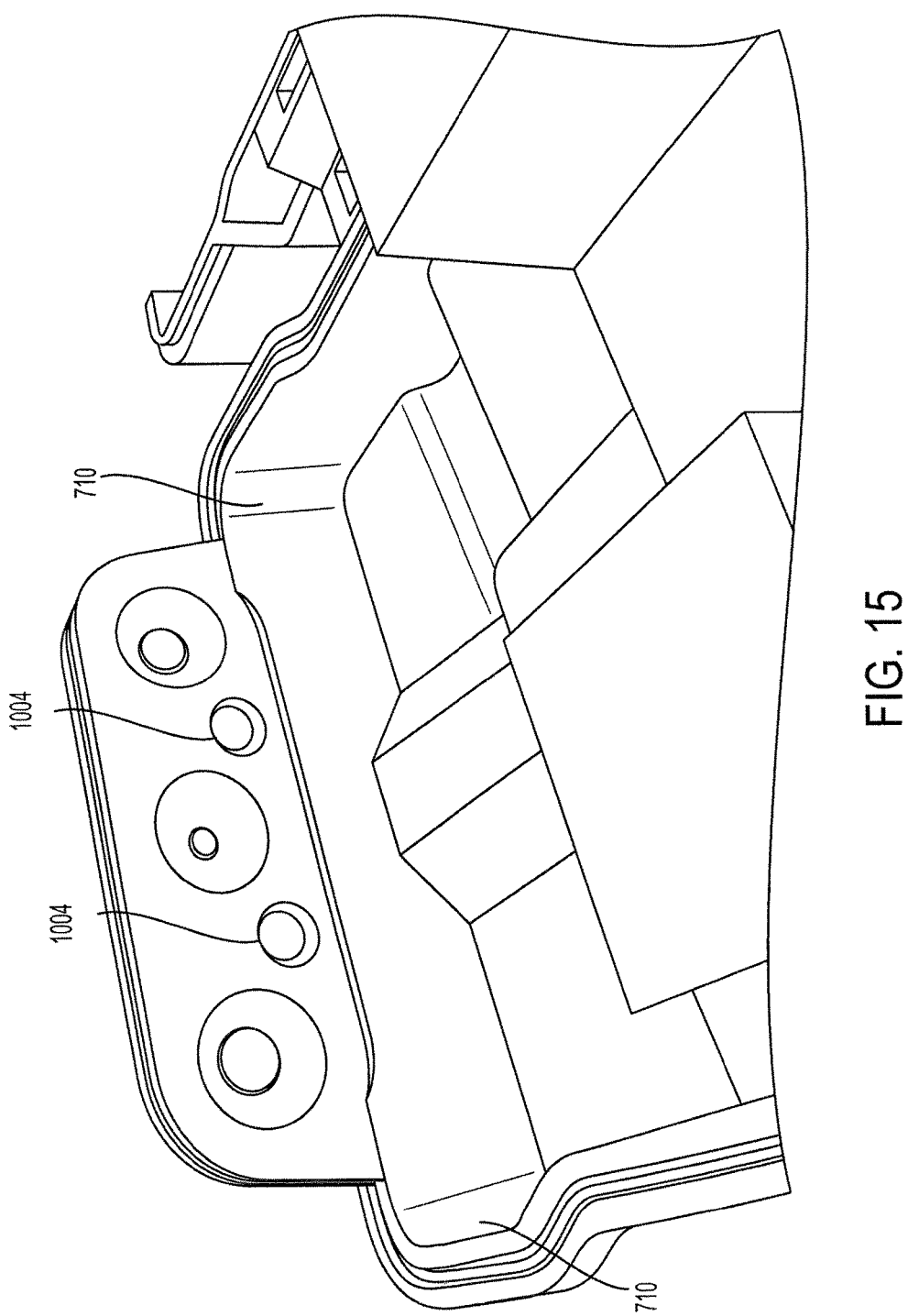
FIG. 15 is an internal top view of the bottom of the enclosure of FIG. 1 according to an embodiment of the present invention.

FIG. 15 is an internal top view of the bottom of the enclosure 100 of FIG. 1. The bottom internal surfaces 710 slope towards the one or more holes 1004 that are created when the removable tear-away drainage plugs 1000 are removed.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. An enclosure for protecting an electronic device, the enclosure comprising:
   a rear base defining a cavity for holding the electronic device;
   a front cover coupled to the rear base and movable between an open position and a closed position;
   a grommet connected to the rear base; and
   a removable tear-away plug having a cylindrical pillar that is integrally formed with and protruding from the grommet and when the cylindrical pillar is pulled outwards, the removable tear-away plug tears away from the grommet and forms a hole that allows water to drain out of the enclosure.

2. The enclosure of claim 1, wherein the rear base has an external surface that has a vertical indented portion that is curved or angular shaped to fit and receive a diameter of a pole, a horizontal indented portion, and a slot that is configured to receive a fastener for attachment to the pole.

3. The enclosure of claim 2, wherein the fastener is a hose clamp or a tie wrap, wherein the vertical indented portion is trapezoidal shaped.

4. The enclosure of claim 1, further comprising:
   one or more snap hooks or pins configured to couple to the electronic device and hold the electronic device within the cavity, wherein the electronic device is suspended above a surface of the rear base.

5. The enclosure of claim 1, further comprising:
   a gasket made of an elastic material that encircles a contour of the rear base that interfaces with a contour of the front cover in the closed position; and
   a latch coupled to the front cover;
   wherein the latch and the gasket are configured to seal the enclosure when the front cover is in the closed position.

6. The enclosure of claim 1, further comprising:
one or more openings configured to receive one or more cables that electrically connect to the electronic device; and
each opening of the one or more openings having an edge, the edge of each opening having a polymer membrane that forms a seal around the one or more cables.

7. The enclosure of claim 6, wherein the one or more openings are positioned on a bottom surface of the enclosure.

8. The enclosure of claim 6, wherein the one or more openings are configured to receive a signal input cable, a signal output cable and a ground cable.

9. The enclosure of claim 1, wherein the front cover is curved so that water runs off a surface of the front cover when the enclosure lies on the rear base.

10. The enclosure of claim 1, wherein the rear base and the front cover each have a protruding portion.

11. The enclosure of claim 10, wherein the protruding portion of the rear base and the protruding portion of the front cover are configured to be shaped as handles when the front cover is in the closed position.

12. The enclosure of claim 10, wherein the rear base has one or more holes that are configured to receive one or more fasteners that mount the enclosure to a wall.

13. The enclosure of claim 12, wherein the one or more holes are positioned on a portion of the rear base covered by a portion of the front cover when the front cover is closed against the rear base.

14. The enclosure of claim 1, wherein the rear base is configured to receive one or more poles of different sizes.

15. The enclosure of claim 1, wherein the rear base has a sloped internal surface that is adjacent to and sloped towards the hole to allow the water to drain out.

16. An enclosure for protecting one or more electronic devices, the enclosure comprising:
a rear base having an inner surface defining a first cavity for holding the one or more electronic devices and an outer surface with a vertical indented portion that is recessed within the rear base;
a front cover coupled to the rear base and defining a second cavity;
a removable tear away plug having a cylindrical pillar that is integrally formed with and protruding from a bottom portion of the rear base and when the cylindrical pillar is pulled outwards, the removable tear-away plug tears away from the rear base and forms a hole that allows water to drain out of the enclosure; and
one or more snap hooks coupled to the rear base and configured to suspend the one or more electronic devices within the first cavity and the second cavity.

17. The enclosure of claim 16, wherein the bottom portion is a grommet.

18. An electronic device enclosure system, comprising:
an electronic device; and
an enclosure having:
a rear base defining a cavity for holding the electronic device and having a bottom portion;
a front cover movable between an open position and a closed position;
a removable tear away plug having a cylindrical pillar that is integrally formed with and protruding from the bottom portion of the rear base and when the cylindrical pillar is pulled outwards, the removable tear-away plug is removed and forms a hole that allows water to drain out of the enclosure; and
one or more snap hooks coupled to the rear base and the electronic device, the one or more snap hooks configured to hold the electronic device within the cavity.

19. The electronic device enclosure system of claim 18, wherein the enclosure has one or more openings on the bottom portion and that are configured to receive one or more cables that connect to the electronic device.

20. The electronic device enclosure system of claim 18, further comprising:
a pole;
a tie wrap securing the rear base to the pole; and
one or more screws securing the rear base to a wall.

* * * * *